United States Patent [19]

Sunami et al.

[11] Patent Number: 4,670,768
[45] Date of Patent: Jun. 2, 1987

[54] COMPLEMENTARY MOS INTEGRATED CIRCUITS HAVING VERTICAL CHANNEL FETS

[75] Inventors: Hideo Sunami, Nishitama; Makoto Ohkura, Fuchu; Shinichiro Kimura, Hachioji, all of Japan

[73] Assignee: Hitachi, Ltd., Tokyo, Japan

[21] Appl. No.: 767,794

[22] PCT Filed: Dec. 14, 1984

[86] PCT No.: PCT/JP84/00597
§ 371 Date: Aug. 14, 1985
§ 102(e) Date: Aug. 14, 1985

[87] PCT Pub. No.: WO85/02716
PCT Pub. Date: Jun. 20, 1985

[30] Foreign Application Priority Data

Dec. 16, 1983 [JP] Japan .................... 58-236160

[51] Int. Cl.[4] .............. H01L 27/02; H01L 29/78; H01L 27/12; H01L 29/06
[52] U.S. Cl. ........................... 357/42; 357/23.4; 357/49; 357/55; 357/56
[58] Field of Search ............. 357/23.4, 42, 49, 55, 357/56

[56] References Cited

U.S. PATENT DOCUMENTS 3,893,155  7/1975  Ogiue ............................ 357/23.4
4,131,907 12/1978  Ouyang ......................... 357/23.4
4,229,756 10/1980  Sato et al. ..................... 357/23.4

Primary Examiner—Gene M. Munson
Attorney, Agent, or Firm—Antonelli, Terry & Wands

[57] ABSTRACT

A semiconductor integrated circuit comprising semiconductor regions in the form of first and second protruding poles that are provided on a semiconductor layer formed on a semiconductor substrate or an insulating substrate, and that are opposed to each other with an insulating region sandwiched therebetween, a p-channel FET provided in the first semiconductor region, and an n-channel FET provided in the second semiconductor region. These FET's have source and drain regions on the upper and bottom portions of the semiconductor regions, and have gate electrodes on the sides of the semiconductor regions. The insulation region between the protruding pole-like semiconductor regions is further utilized as the gate electrode and the gate insulating film.

5 Claims, 14 Drawing Figures

COMPLEMENTARY MOS INTEGRATED CIRCUITS HAVING VERTICAL CHANNEL FETS

DESCRIPTION

1. Technical Field

The present invention relates to semiconductor integrated circuits, and particularly to semiconductor integrated circuits (C-MOS circuits: complementary MOS circuits) having a p-channel FET (field-effect transistor) and an n-channel FET.

2. Background Art

A semiconductor integrated circuit having an n-channel FET and a p-channel FET can be represented by a CMOS integrated circuit employing insulated gate-type field-effect transistors (MOS transistors) as FET's.

The CMOS integrated circuit is fundamentally based upon an inverter circuit which consists of an n-channel MOS transistor 1 and a p-channel MOS transistor 2 as shown in FIG. 1, wherein reference numeral 3 denotes an input terminal, 4 denotes an output terminal, 5 denotes a Vss terminal, and 6 denotes a Vcc terminal.

Referring to FIG. 2, the inverter circuit of FIG. 1 consists of the n-channel MOS transistor 1 and the p-channel MOS transistor 2 formed in a p-type well region 9 and an n-type well region 11, that are formed in a silicon substrate 10. Here, though both the p-type well region and the n-type well region are formed, the silicon substrate 10 may be utilized to serve as either one of them, so that only either one well region needs be formed. In FIG. 2, the n-type well region and the p-type well region are formed in the $n^-$-type well region. In FIG. 2, furthermore, reference numeral 7 denotes $n^+$-type regions, 8 denotes $p^+$-type regions, 12 denotes field insulators for device isolation, 13 denotes gate electrodes, 14 denotes insulators, 90 denotes p-type regions, and 91 denotes n-type regions.

The CMOS structure has heretofore been formed in plane as shown in FIG. 2. That is, a wide field oxide film 12 must be formed in order to electrically isolate the n-channel MOS transistor 1 from the p-channel MOS transistor 2. Further, the p-type well region and the n-type well region must be separated from each other when there arises a problem of breakdown voltage therebetween due to their high impurity concentrations. In either case, the CMOS device is prevented from being integrated to a high degree. In the integrated circuit having a 2 $\mu$m-long gate level, for instance, the field oxide film 12 must have a width of about 10 $\mu$m to isolate the wells. Even in the integrated circuit having a 1 $\mu$m-long gate level, the field oxide film must have a width of about 5 $\mu$m.

The above-mentioned known C-MOS technique has been disclosed in Japanese Patent Publication Nos. 44555/1974 and 33229/1974.

DISCLOSURE OF INVENTION

Further, so-called vertical MOSFET's and V-grooved MOSFET's having resembling appearance or construction have been disclosed in Japanese Patent Publication Nos. 26823/1968 and 456/1968.

DISCLOSURE OF THE INVENTION

The object of the present invention is to provide well-to-well isolation of a high-density structure that had been one of the greatest obstacles against realizing the semiconductor integrated circuits of the CMOS construction in a highly integrated form.

According to the present invention, the skeltal structure resides in that a p-well (n-channel forming region) and an n-well (p-channel forming region) are formed being opposed to each other with a thin insulating region interposed therebetween, in order to realize a CMOS integrated circuit in a highly integrated form.

According to the present invention, an n-channel MOS transistor is isolated from a p-channel MOS transistor by a thin insulating region, making it possible to obtain the CMOS integrated circuit in a highly integrated form and to very efficiently prevent the occurrence of a latch-up that is detrimental to the CMOS construction. Moreover, it is allowed to form transistors having a particularly large transfer conductance in very small regions.

BEST MODE FOR CARRYING OUT THE INVENTION

Figure 3:
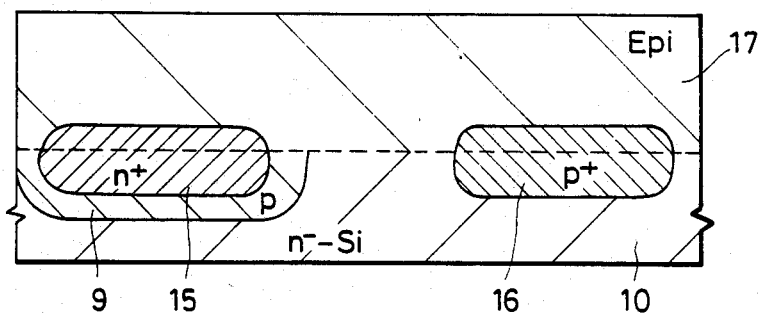
FIGS. 3, 4, 5 and 6 are section views showing the manufacturing steps according to an embodiment of the present invention.
Figure 4:
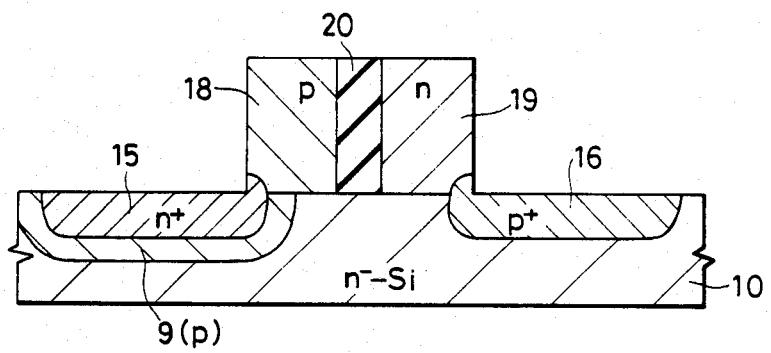

Embodiment of FIGS. 3 to 7:

A first embodiment of the present invention is shown in FIGS. 3 to 7, wherein the same reference numerals denote the same or equivalent portions. According to the first embodiment of the present invention, protruding poles 18 and 19 are formed on a silicon substrate 10. As shown in FIG. 3, an $n^+$-type region 15 and a $p^+$-type region 16 having an impurity concentration of greater than $10^{20}$ cm$^{-3}$ are formed in the n-type silicon substrate 10 (about 1 to 100 ohms-cm, and a concentration of $1 \times 10^{14}$ $1 \times 10^{17}$ cm$^{-3}$) by the customarily employed ion implantation method or the thermal diffusion method. The $n^{30}$-type region 15 has a depth of about 0.2 to 1 $\mu$m, and the $p^+$-type region has a depth of about 0.4 to 1.5 $\mu$m. Since the silicon substrate 10 of the n-type type is employed, the lower periphery of the $n^+$-type region 15 is wrapped by a p-type well region 9 which is formed to have a depth of about 1 to 5 $\mu$m. If the p-type well region 9 is formed being self-aligned using a mask for forming the $n^+$-type region 15, no extra region is needed for mask alignment, and the elements can be formed highly densely. Even when the same mask is used, the p-type well region 9 is so formed as to wrap the n+-type region 15 owing to the diffusion of impurities. Further, an n−-type or a p−-type epitaxial layer 17 is grown to have a thickness of about 0.5 to 2 μm. Then, as shown in FIG. 4, the protruding poles 18, 19 are formed by dry etching, and p-type dopants and n-type dopants are implanted thereinto, respectively, so that they cancel or add up to the impurities that have been added already in the epitaxial layer 17 to accomplish an impurity concentration over a range of $10^{14}$ to $10^{17}$ cm$^{-3}$ as desired. Thus, the p-type protruding pole 18 and the n-type protruding pole 19 are formed.

When the dry etching or the ion implantation is to be effected, it is of course allowable to use, as a so-called mask, an anti-etching film or an anti-ion implantation film of any desired shape relying upon the widely known photolithography.

Then, an isolation-insulator 20 is formed between the two protruding poles by the thermal oxide or the chemical vapor deposition. The isolation-insulator 20 has a thickness of about 0.1 to 1 μm between the p-type region 18 and the n-type region 19. When the chemical vapor deposition method is used, the insulator 20 is uniformly deposited around the protruding poles, and the gap between the protruding poles 18 and 19 is filled with it. Then, the whole protruding poles 18 and 19 are subjected to the solution etching or dry etching to remove the insulator 20 except from the gap as shown in FIG. 4.

When the thermal oxide film is to be formed, the oxide film grows from both the protruding poles 18 and 19; the thermal oxidation is discontinued when the oxide has met with each other from both sides. Then, the isotropic etching is effected to remove the whole oxide film in a manner to peel it off.

The oxide film 20 is protected by the protruding poles 18, 19 and is not subjected to the etching. Therefore, the structure shown in FIG. 4 is obtained.

Figure 5:
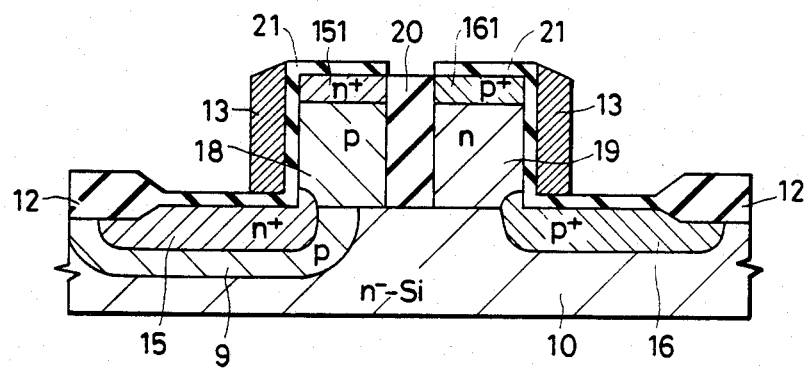

Then, as shown in FIG. 5, a field oxide film 12 is formed to have a thickness of 200 to 1000 nm on the isolation region by the local oxidation of silicon or the like and a gate oxide film 21 is formed by the thermal oxidation method to have a thickness of 5 to 100 nm. In this case, an anti-oxidation film such as silicon nitride ($Si_3N_4$) film or the like is formed on the areas except the portion where the field oxide film 12 is formed, and is oxidized.

Figure 6:
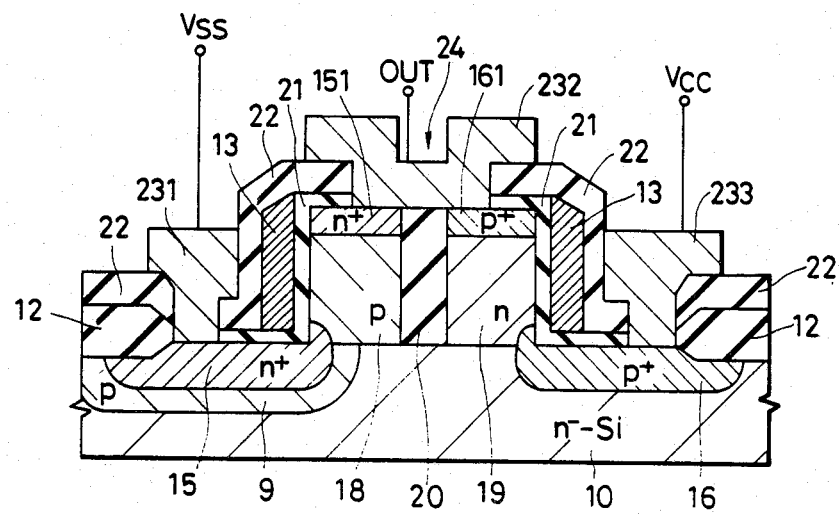

Thereafter, polycrystalline silicon, a refractory metal, or a silicide thereof is deposited on the whole surface thereof by the sputtering method or the chemical vapor deposition method. The whole surface is subjected to the dry etching of a strong directivity while leaving a resist resin for dry etching on the wiring portions. Then, the film left on the side walls of the protruding poles 18, 19 serve as a gate 13. The film that serves as the gate 13 has a thickness of about 0.1 to 0.8 μm. An $n_{30}$-type region 151 and a p+-type region 161 are then formed by the ion implantation, diffusion or the like to have a depth of about 0.1 to 0.5 μm. Then, as shown in FIG. 6, an intermediate insulator 22 as represented by the CVD·PSG is deposited to have a thickness of 0.5 to 1.0 μm, a connection hole 24 is formed in a desired portion, and electrodes 231 to 233 as represented by aluminum are formed. The electrodes 231, 232 and 233 serve as Vss terminal, output terminal, and Vcc terminal, respectively.

Figure 7:
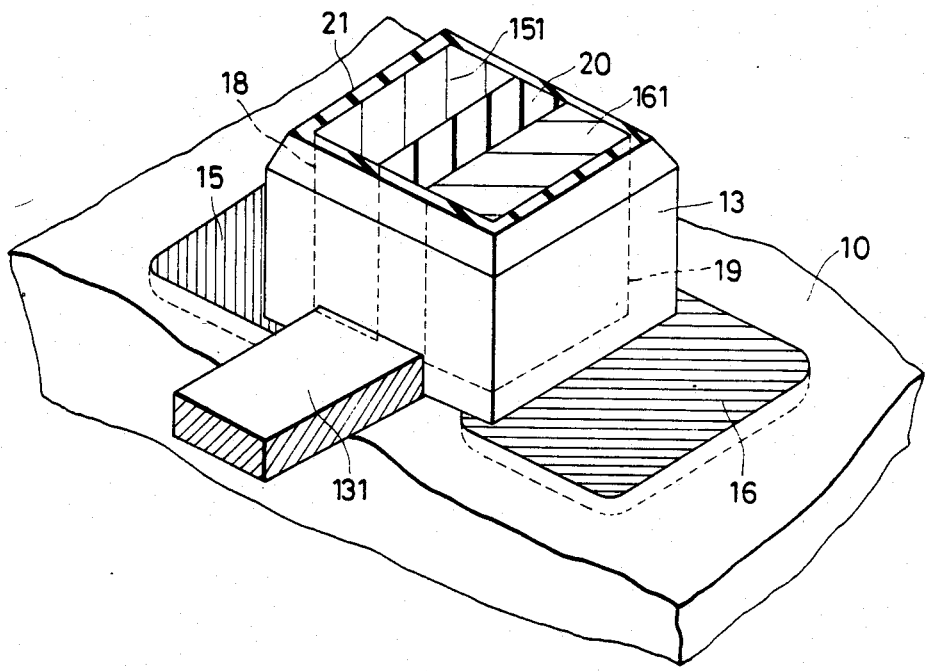
FIG. 7 is a bird's-eye view showing a first embodiment of the present invention.

FIG. 7 is a birds-eye view showing, in cross section, the structure of the embodiment of FIG. 5. A flat portion 131 of the gate 13 is used for connection to the wiring or the electrode.

Figure 8:
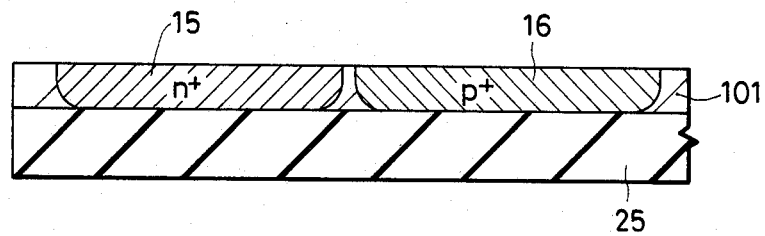
FIG. 8 is a section view of a substrate employed for a second embodiment of the present invention.
Figure 9:
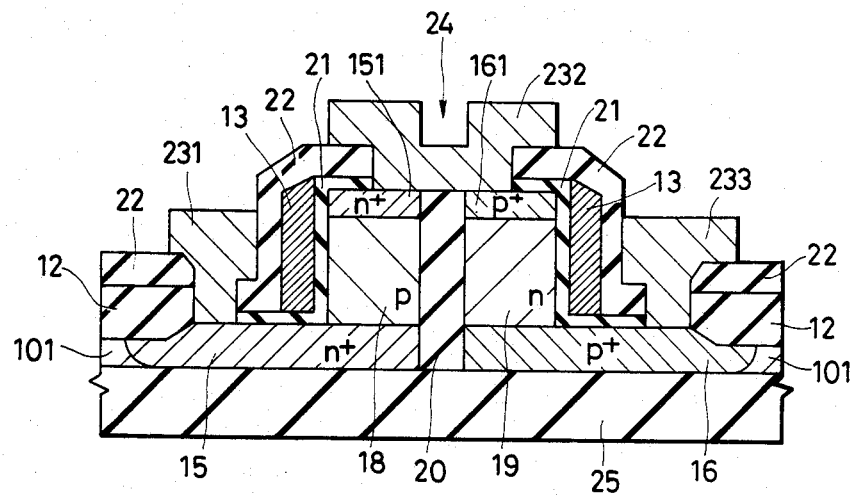
FIG. 9 is a section view showing the second embodiment of the present invention.

Embodiment of FIGS. 8 and 9:

According to a second embodiment of the present invention, when the same elements as those of the first embodiment are to be formed on the insulating substrate, the n+-type region 15 needs not be electrically isolated from the substrate 10. Therefore, the degree of integration can be further increased.

That is, as shown in FIG. 8, a thin silicon substrate layer 101 is formed on the whole surface of a sapphire or a single crystalline spinel substrate 25, and the n+-type region 15 and the p+-type region 16 are formed in the layer 101. Thereafter, the structure shown in FIG. 9 is obtained through the same steps as those explained with reference to FIGS. 4 to 6. The n+-type region 15 and the p+-type region 16 are completely isolated by the insulator 20 and the insulating substrate 25. Therefore, there is no need of forming the p-type well 9, and the mutual interference effect can be minimized.

In FIG. 9, furthermore, thickness of the field oxide film 12 can be increased until it penetrates through the silicon substrate 101, making it possible to establish more complete isolation from other elements.

The insulator 20 should reach the insulating substrate 25 so as to isolate the silicon substrate 101.

Therefore, when the insulator 20 is to be formed by the chemical vapor deposition, the silicon substrate 101 must be etched prior to depositing the insulator.

Figure 10:
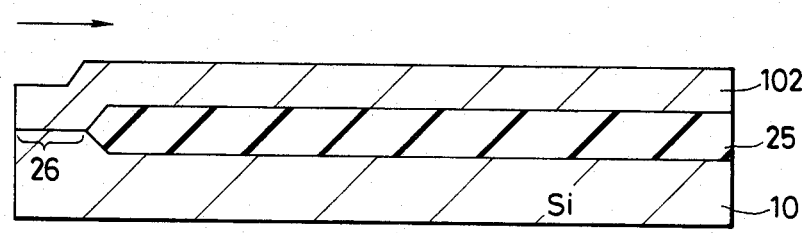
FIG. 10 is a section view of a substrate employed for a third embodiment of the present invention.
Figure 11:
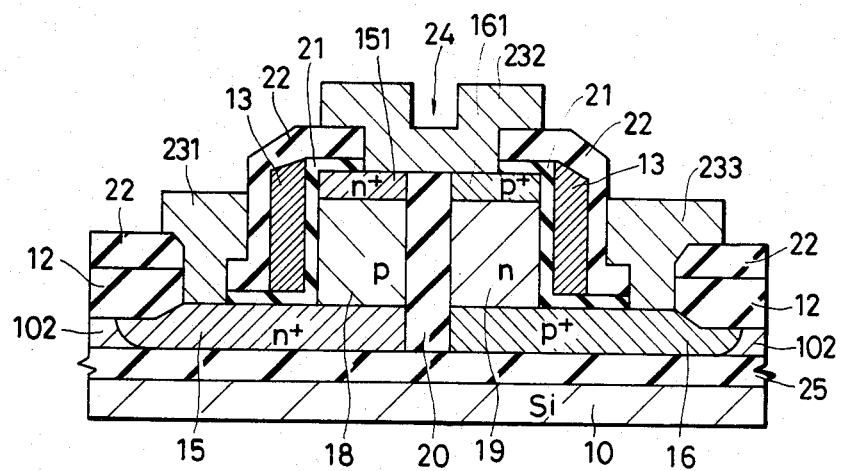
FIG. 11 is a section view showing the third embodiment of the present invention.

Embodiment of FIGS. 10 and 11:

According to a third embodiment of the present invention as shown in FIG. 10, the insulating substrate is comprised of an insulating-film substrate 25 such as of thermal oxide, a sapphire or spinel formed on the silicon substrate 10, and an SOI(silicon on insulator)-Si substrate 102 formed by the liquid-phase lateral epitaxial growth method from a seeded region 26 where the silicon substrate 10 is exposed by using the laser or a strip heater. The SOI-single crystalline silicon substrate 102 can be formed without using the seeded region 26. Generally, however, the crystalline substrate 102 of good quality can be formed when the seeded region is used.

Thereafter, an integrated circuit of FIG. 11 is formed in the same manner as the above-mentioned embodiment of FIG. 9. The seeded region 26 is not shown in FIG. 11.

According to this embodiment employing the silicon substrate 10, it is allowable to form resistors and capacitors in the substrate to use them in combination with the CMOS transistor of the present invention formed thereon via the insulating film 25. It is further allowable to form an MOS transistor on the surface of the silicon substrate 10 and to form the CMOS transistor of the present invention thereon via the insulating film 25 in two-layer construction, in order to enhance the functions and to increase the degree of integration.

Figure 12:
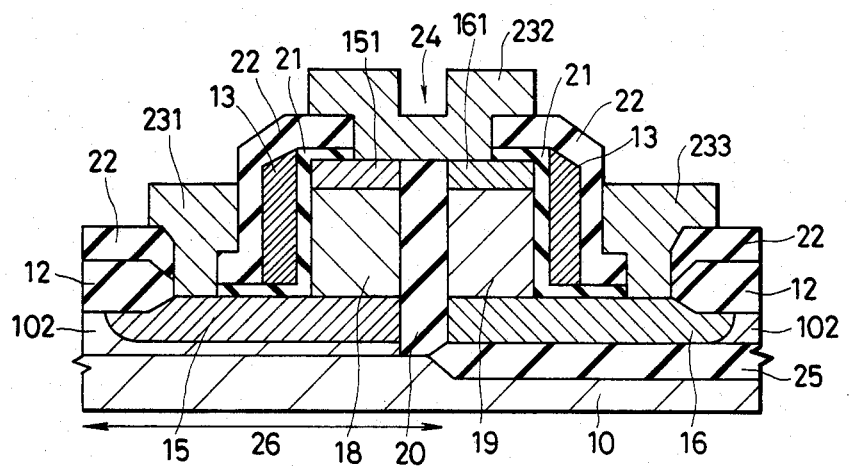
FIG. 12 is a section view showing a fourth embodiment according to the present invention.

Embodiment of FIG. 12:

In the embodiment of FIG. 11, both the n+-type region 15 and the p+-type region 16 are formed in the SOI-Si substrate layer 102. However, either one of them may be formed in the seeded region 26 as shown in FIG. 12. This enables the one region (n+-type region in FIG. 12) to be connected to the silicon substrate 10, presenting great advantage.

Figure 1:
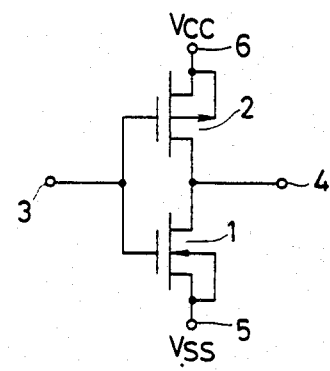
FIG. 1 is a circuit diagram of a conventional CMOS inverter.
Figure 2:
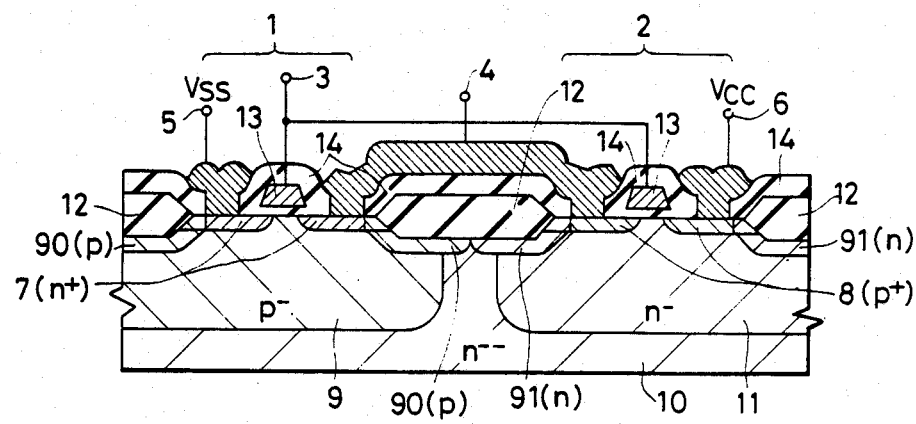
FIG. 2 is a section view showing the structure of a conventional CMOS inverter.

In the fourth embodiment of the present invention, an n-type protruding portion 19 and a p-type protruding portion 18 correspond to the n-type well and the p-type well of the CMOS transistor, respectively. These wells are isolated by the isolation-insulator 20 having a thickness of 0.1 to 1 μm, which is much smaller than the width of the isolation region of the the conventional CMOS construction shown in FIG. 2 that ranges as great as 5 to 10 μm.

Figure 13:
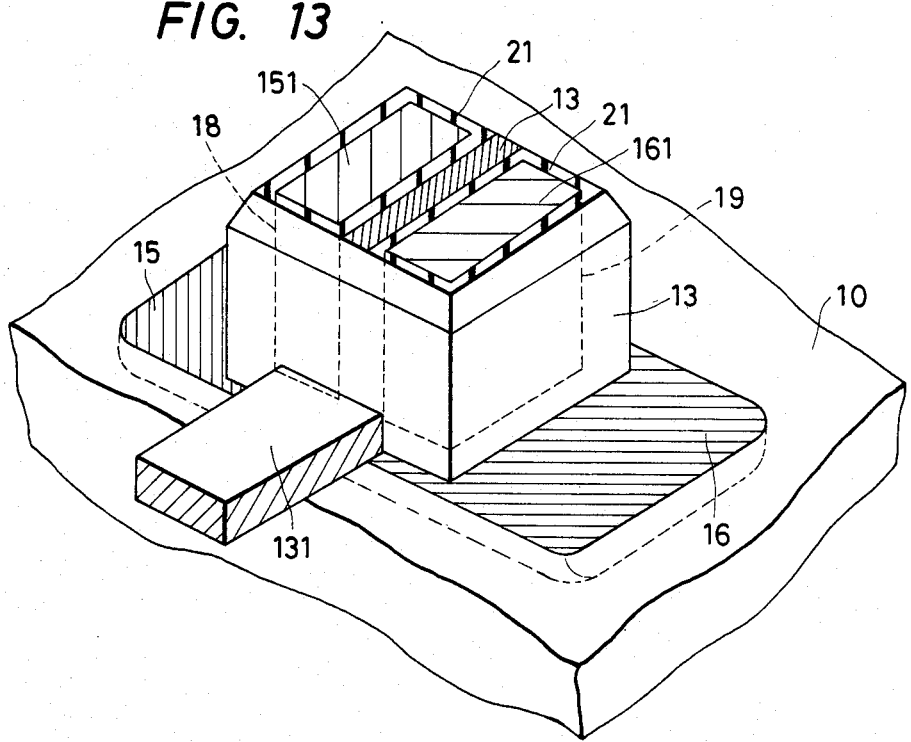
FIG. 13 is a bird's-eye view showing a fifth embodiment according to the present invention.

Embodiment of FIG. 13:

In the aforementioned embodiments of the present invention, the isolation region is filled with the insulator 20. However, this region may be packed with a thermally oxidized film SiO$_2$ and crystalline silicon. According to the present invention, the whole region 20 should work as an insulation region, and no limitation is imposed on the material constituting the insulation region.

FIG. 13 shows a fifth embodiment of the present invention. In this case, the isolation-insulator 20 of the embodiment of FIG. 6 is substituted by the combination of a gate oxide film 21 and a gate 13. Side surfaces of the protruding silicon poles 18, 19 are all surrounded by the gate oxide film 21, and the region between the two protruding poles is packed with the gate 13. In this case, the whole side surfaces of the protruding poles 18, 19 serve as a channel of the transistor. Therefore, a transistor having a large transfer conductance is obtained in a very small region.

In the embodiment of FIG. 6, only the interface between the protruding pole 18 and the insulating film 21 serves as the channel. In the fifth embodiment, however, the channel can be formed even on the surface opposed to the abovesaid channel of the protruding pole 18, since the gate 13 exists in the insulator 20.

The n$^+$-type region 15 must be extended up to the channel-forming region. Concretely speaking, the device should be constructed as shown in FIGS. 9, 11 and 12.

Similarly, the channel can be formed along the whole peripheral surface of the protruding pole 18.

The same also holds true even for the protruding pole 19.

Figure 14:
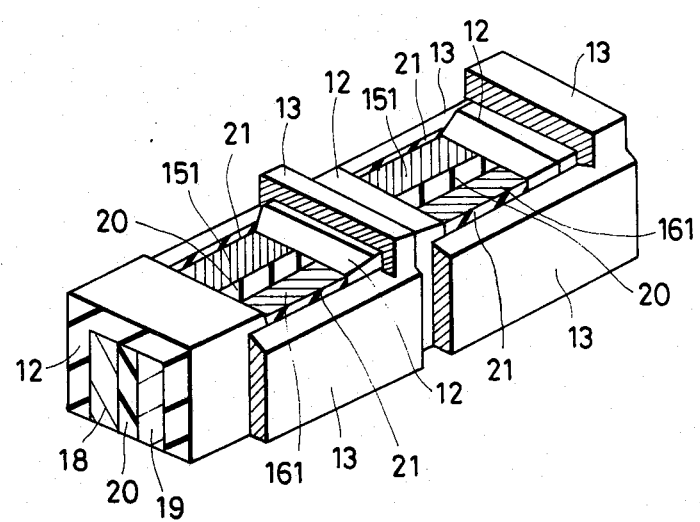
FIG. 14 is a bird's-eye view showing a sixth embodiment according to the present invention.

Embodiment of FIG. 14:

FIG. 14 illustrates a sixth embodiment of the present invention.

In the aforementioned embodiments of the present invention, the p-type and n-type protruding poles 18, 19 had been independently provided. In the sixth embodiment, however, a plurality of p-type protruding poles and a plurality of n-type protruding poles are formed contiguous to each other in the form of beams. To isolate from the neighboring CMOS inverters, thick field oxide films 12 are formed at desired portions. The gate oxide films 21 are formed on the side surfaces the protruding beams, and the gate 13 is formed across the beams. FIG. 14 shows the case where two CMOS inverters are formed.

In the aforementioned embodiments, the p-type well region 9 had been provided necessarily. The p-type well region 9, however, may not be formed provided the substrate 10 has a high resistance. In this case, the substrate should have a resistance of greater than 100 ohms-cm, and preferably about one kiloohms-cm.

The substrate will have an impurity concentration of from $1 \times 10^{13}$ to $1 \times 10^-$cm$^{-3}$.

Industrial Applicability

In the conventional CMOS transistor formed on the silicon substrate, the n-channel transistor and the p-channel transistor interfered with each other giving rise to the occurrence of a so-called latch-up, which caused the integration circuit to become inoperative or broken down.

The CMOS transistors are now being regarded as the main transistors in the MOS-type integrated circuits that occupy a majority proportion of the semiconductor industries. However, the latch-up is one of the great factors that hinders the CMOS integrated circuits from being integrated highly densely, depriving the CMOS transistors of their merits to a considerable degree.

According to the present invention, not only the above defect inherent in the CMOS transistor is removed but also the channel is formed in the vertical direction, making it possible to provide a large current driving ability with a very small plane area. Therefore, the present invention is adapted to further increasing the density of integration and can be applied to general CMOS integrated circuits. Namely, the present invention provides the technique for increasing the integration density that can be applied to most of the MOS integrated circuits, and offers very great industrial values.

What is claimed is:

1. A semiconductor integrated circuit comprising:
   a substrate having a semiconductor layer on at least a first main surface thereof;
   a first region of a first type of conductivity formed in said semiconductor layer;
   a second region of a second type of conductivity formed in said semiconductor layer;
   a first semiconductor protruding a pole-like region of the second type of conductivity that is so provided as to come into contact, with at least a portion thereof, with said first region, and a second semiconductor protruding pole-like region of the first type of conductivity that is so provided as to come into contact, with at least a portion thereof, with said second region, wherein said first and second protruding pole-like regions are provided as a mesa;
   a first isolation region provided between said first semiconductor protruding pole-like region and said second semiconductor protruding pole-like region;
   a third region of the first type of conductivity provided in said first semiconductor protruding pole-like region;
   a fourth region of the second type of conductivity provided in said second semiconductor protruding pole-like region;
   a first gate electrode formed on said first semiconductor protruding pole-like region via a first gate insulating film opposite to the first isolation region; and
   a second gate electrode formed on said second semiconductor protruding pole-like region via a second gate insulating film opposite to the first isolation region.

2. A semiconductor integrated circuit according to claim 1, wherein said substrate is an insulator, and said first isolation region is in contact with said substrate.

3. A semiconductor integrated circuit according to claim 1, wherein said substrate has a semiconductor layer formed on a semiconductor substrate via a first insulator and said first isolation region is in contact with said first insulator.

4. A semiconductor integrated circuit according to claim 1, wherein said first isolation region is comprised of a first insulation film, a third gate electrode, and a second insulation film.

5. A semiconductor integrated circuit comprising:

a substrate having a semiconductor layer on at least a first main surface thereof;

a first region of a first type of conductivity formed in said semiconductor layer;

a second region of a second type of conductivity formed in said semiconductor layer;

a first semiconductor proruding pole-like region of the second type of conductivity that is so provided as to come into contact, with at least a portion thereof, with said first region, and a second semiconductor protruding pole-like region of the first type of conductivity that is so provided as to come into contact, with at least a portion thereof, with said second region, wherein the first and second semiconductor protruding pole-like regions are provided as a mesa;

a third region of the first type of conductivity provided in said first semiconductor protruding pole-like region;

a fourth region of the second type of conductivity provided in said second semiconductor protruding pole-like region;

a first gate electrode formed on said first semiconductor protruding pole-like region via first insulating film; and a second gate elecrode formed on said second semiconductor protruding pole-like region via a second insulating film; and a first isolation region provided between said first semiconductor protruding pole-like region and said second semiconductor proruding pole-like region, wherein said substrate is an insulator, and said first isolation region is in contact with said substrate.

* * * * *